(12) United States Patent
Park et al.

(10) Patent No.: US 10,779,396 B2
(45) Date of Patent: Sep. 15, 2020

(54) PRINTED CIRCUIT BOARD HAVING EMBEDDED ELECTRONIC DEVICE

(71) Applicant: Samsung Electro-Mechanics Co., Ltd., Suwon-si (KR)

(72) Inventors: Yeo-Il Park, Suwon-si (KR); Yong-Duk Lee, Suwon-si (KR); Sang-Ho Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/599,172

(22) Filed: Oct. 11, 2019

(65) Prior Publication Data

US 2020/0178385 A1 Jun. 4, 2020

(30) Foreign Application Priority Data

Dec. 4, 2018 (KR) .................. 10-2018-0154346

(51) Int. Cl.
*H05K 1/02* (2006.01)
*H05K 1/18* (2006.01)
*H05K 3/46* (2006.01)
*H05K 1/11* (2006.01)
*H05K 3/42* (2006.01)

(52) U.S. Cl.
CPC .......... *H05K 1/0218* (2013.01); *H05K 1/116* (2013.01); *H05K 1/185* (2013.01); *H05K 3/429* (2013.01); *H05K 3/4697* (2013.01); *H05K 2201/0715* (2013.01); *H05K 2201/0723* (2013.01)

(58) Field of Classification Search
CPC ...................... H05K 2201/0723; H05K 1/185
See application file for complete search history.

(56) References Cited

U.S. PATENT DOCUMENTS

| 7,886,433 | B2 | 2/2011 | Bae et al. |
| 8,736,033 | B1 | 5/2014 | Chuo et al. |
| 10,068,855 | B2* | 9/2018 | Kim ............ H01L 25/0655 |
| 2007/0001286 | A1* | 1/2007 | Chiu ............... H01L 23/13 257/700 |
| 2010/0159647 | A1* | 6/2010 | Ito .................. H01L 23/49822 438/124 |

FOREIGN PATENT DOCUMENTS

JP 2004-319605 A 11/2004

* cited by examiner

*Primary Examiner* — Hung V Ngo
(74) *Attorney, Agent, or Firm* — NSIP Law

(57) ABSTRACT

A printed circuit board includes a first insulating layer having a cavity, a metal pattern including a first shielding pattern disposed on an inner wall of the cavity and a second shielding pattern spaced apart from the first shielding pattern and covering the first shielding pattern, an electronic device positioned in the cavity and surrounded by the first shielding pattern and the second shielding pattern, and a second insulating layer stacked on the first insulating layer and embedding the electronic device therein.

18 Claims, 3 Drawing Sheets

PRINTED CIRCUIT BOARD HAVING EMBEDDED ELECTRONIC DEVICE

CROSS REFERENCE TO RELATED APPLICATIONS

This application claims the benefit under 35 U.S.C. 119(a) of Korean Patent Application No. 10-2018-0154346 filed on Dec. 4, 2018, in the Korean Intellectual Property Office, the entire disclosure of which is incorporated herein by reference for all purposes.

BACKGROUND

1. Technical Field

The present disclosure relates to a printed circuit board having an embedded electronic device.

2. Description of the Background

There is a technical demand for an electronic apparatus in an information technology (IT) field such as a mobile phone to be slimmer and lighter weight. In accordance with such a technical demand, a technique for inserting an electronic component such as an integrated chip (IC), an active element, or a passive element into a board may be needed. Thus, in recent years, various techniques have been developed for embedding an electronic component in a board.

However, electromagnetic interference (EMI) may occur between components embedded in a board due to electromagnetic waves and cause problems in driving characteristics of the components.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first insulating layer having a cavity, a metal pattern including a first shielding pattern disposed on an inner wall of the cavity and a second shielding pattern spaced apart from the first shielding pattern and covering the first shielding pattern, an electronic device positioned in the cavity and surrounded by the first shielding pattern and the second shielding pattern, and a second insulating layer stacked on the first insulating layer and embedding the electronic device therein.

The metal pattern may further include a third shielding pattern disposed on the second insulating layer and positioned to cover opened surfaces of the cavity.

The third shielding pattern may be connected to one or more of the first shielding pattern and the second shielding pattern to form a shield can structure surrounding the electronic device.

The metal pattern may further include a ground pattern serving as a ground circuit, and one or more of the first shielding pattern, the second shielding pattern, and the third shielding pattern may be connected to the ground pattern.

The first insulating layer may be a core layer and the cavity may penetrate through the core layer, and the second insulating layer may be stacked on each of both surfaces of the first insulating layer and may fill the cavity.

In another general aspect, a printed circuit board includes a cavity, an electronic device disposed in the cavity, and a metal pattern including a first shielding pattern spaced apart from and surrounding a second shielding pattern, which in turn is spaced apart from and surrounds the electronic device.

The third shielding pattern may include a multilayer structure, wherein the layers are spaced apart from each other and from the electronic device by the second insulating layer.

In another general aspect, a printed circuit board includes a cavity, an electronic device disposed in the cavity, and a metal pattern including a side shielding pattern disposed on a wall of the cavity, spaced apart from and surrounding the electronic device, and an end shielding pattern connected to the side shielding pattern to form a shield can structure surrounding the electronic device, wherein the end shielding pattern includes a multilayer structure, wherein the layers are spaced apart from each other and from the electronic device by an insulating layer.

The side shielding pattern may include a first shielding pattern spaced apart from and surrounding a second shielding pattern, which in turn is spaced apart from and surrounds the electronic device.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
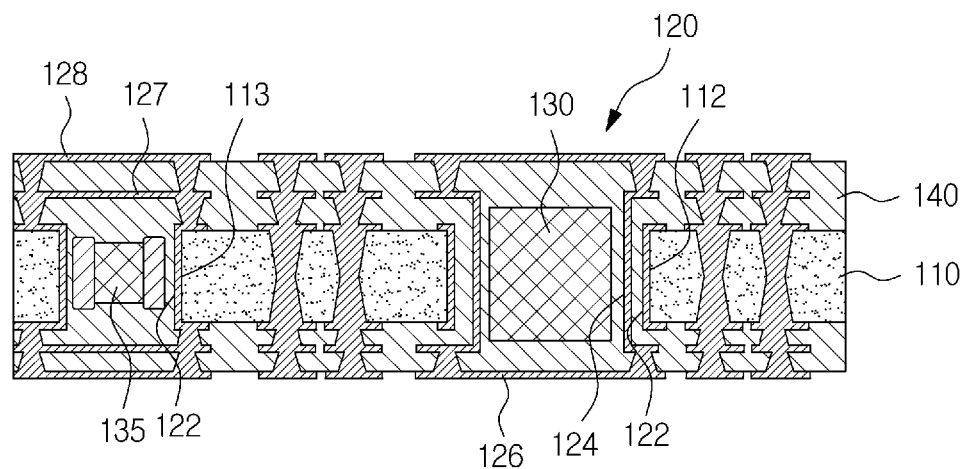
FIG. 1 is a view illustrating a printed circuit board having an embedded electronic device according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

The present disclosure is directed to a printed circuit board having an embedded electronic device capable of shielding electromagnetic interference (EMI) occurring between embedded electronic devices.

FIG. 1 is a view illustrating a printed circuit board having an embedded electronic device according to one or more examples. Referring to FIG. 1, a printed circuit board having an embedded electronic device according to one or more examples may include a first insulating layer 110, a metal pattern 120, an electronic device 130 and a second insulating layer 140.

The first insulating layer 110 may electrically insulate a circuit pattern of the printed circuit board. The first insulating layer 110 may be formed of a resin material. The first insulating layer 110 may be formed of a thermosetting resin such as an epoxy resin or a thermoplastic resin such as a polyimide (PI). The first insulating layer 110 may be formed to have a form of a prepreg (PPG) or a build-up film.

The first insulating layer 110 may have a cavity 112 into which the electronic device 130 is inserted. The cavity 112 may be a groove formed in the first insulating layer 110 and may have a space in which the electronic device 130 is accommodated.

Referring to FIG. 1, the first insulating layer 110 of the present examples may be a core layer disposed at a center of the printed circuit board. Here, the cavity 112 may be formed to penetrate through the core layer.

In the present examples, a penetration type cavity 112 is formed in the first insulating layer 110, but is not limited thereto. The cavity may be formed to have a shape of a recessed groove in one surface of the first insulating layer 110, and the recessed groove having a closed bottom.

The metal pattern 120 may be formed on each of the first insulating layer 110 and the second insulating layer 140. The metal pattern 120 may be formed of a metal such as copper and formed on one surface, another surface or an inner portion of each of the first and second insulating layers 110 and 140. For example, the metal pattern 120 may include a circuit pattern provided with a via, a pad, etc., the via penetrating through the first insulating layer 110 and/or the second insulating layer 140 and the pad being connected to the via.

For example, the metal pattern 120 of the present examples may include a first shielding pattern 122 and a second shielding pattern 124 formed in a double structure. The first shielding pattern 122 may be formed on an inner wall of the cavity 112 and the second shielding pattern 124 may be formed spaced apart from the first shielding pattern 122. Here, the second shielding pattern 124 may be formed to cover a portion, for examples, a whole of the first shielding pattern 122. Accordingly, the first shielding pattern 122 and the second shielding pattern 124 may be formed in a double shielding structure on a side surface of the cavity 112.

Referring to FIG. 1, the first shielding pattern 122 may be formed on a side wall of the penetration type cavity 112 of the first insulating layer 110. Here, the first shielding pattern 122 may be formed continuously along the side wall of the cavity 112 to surround an inner space of the cavity 112.

In addition, in a space surrounded by the first shielding pattern 122, the second shielding pattern 124 may be positioned like a wall that is spaced apart from the first shielding pattern 122 at a predetermined interval. Accordingly, a double wall structure may be formed, in which a center space of the cavity 112 is surrounded first by the second shielding pattern 124 and then again by the first shielding pattern 122.

Meanwhile, the present examples illustrate that the first and second shielding patterns 122 and 124 are formed in a double structure on the sidewall of the cavity 112 of a penetration type; however, the present examples are not limited thereto. In a cavity having a recessed groove structure, the first and second shielding patterns 122 and 124 may be formed in the double structure on a bottom surface of the cavity.

The electronic device 130 may refer to an electronic component such as an integrated chip (IC), an active element, or a passive element. The electronic device 130 may be inserted into and positioned in the cavity 112 of the first insulating layer 110, and then embedded in the second insulating layer 140.

Referring to FIG. 1, the electronic device 130 positioned in the cavity 112 of the first insulating layer 110 may have each side surface doubly surrounded by the first shielding pattern 122 and the second shielding pattern 124.

The second insulating layer 140 may electrically insulate the metal pattern 120 from the electronic device 130. The second insulating layer 140 may be formed to have a form of a prepreg (PPG) or a build-up film using a material similar to the first insulating layer 110. Alternatively, the second insulating layer 140 may be formed of a material or formed by a method, different from the first insulating layer 110.

The second insulating layer 140 may be stacked on the first insulating layer 110 and may embed the electronic device 130 therein. For example, the second insulating layer 140 may fill the cavity 112 into which the electronic device 130 is inserted, thereby embedding the electronic device 130 therein.

Referring to FIG. 1, the second insulating layer 140 may be stacked on each of both surfaces of a core layer in which the penetration type cavity 112 is formed, and the second insulating layer 140 may be introduced into the cavity 112 to embed the electronic device 130 therein. In the insulating layer 140 introduced into the cavity 112, the first shielding pattern 122, the second shielding pattern 124 and the electronic device 130 may be sequentially positioned spaced apart from one another.

In addition, the metal pattern 120 may further include a third shielding pattern 126 positioned to cover opened surfaces of the cavity 112. The third shielding pattern 126 may be formed on the second insulating layer 140 stacked on the first insulating layer 110.

Referring to FIG. 1, in the core layer of the present examples, the cavity 112 may be opened upwardly and downwardly and a pair of third shielding patterns 126 may be formed on upper and lower surfaces of the cavity 112, which is opened, to cover the upper and lower surfaces of the cavity 112. Accordingly, side surfaces and upper and lower surfaces of the electronic device 130 may be wholly covered by the first to third shielding patterns 122, 124 and 126 and therefore, an electromagnetic wave emitted from the electronic device 130 may be shielded.

Here, the third shielding pattern 126 may be connected to one or more of the first shielding pattern 122 and the second shielding pattern 124. For example, the third shielding pattern 126 may be connected to the first shielding pattern 122 or the second shielding pattern 124 through a via. Accordingly, all of the side surfaces and the upper and lower surfaces of the electronic device 130 may be surrounded by a single connected metal structure and therefore, a shield can structure surrounding the electronic device 130 may be formed in the printed circuit board.

In addition, the metal pattern 120 may further include a ground pattern serving as a ground circuit. Here, at least one of the first shielding pattern 122, the second shielding pattern 124 and the third shielding pattern 126 may be connected to the ground pattern, so that the shield can structure formed of the shielding patterns 122, 124 and 126 may be grounded.

Meanwhile, depending on a characteristic of an electronic device 135, only the first shielding pattern 122 may be formed in a cavity 113, and third shielding patterns 127 and 128 may be formed in a multilayer structure in which the third shielding patterns 127 and 128 may cover an opened surface of the cavity 113.

FIGS. 2 to 9 are views illustrating sequential processes of a method of manufacturing a printed circuit board having an embedded electronic device according to one or more examples.

Figure 2:
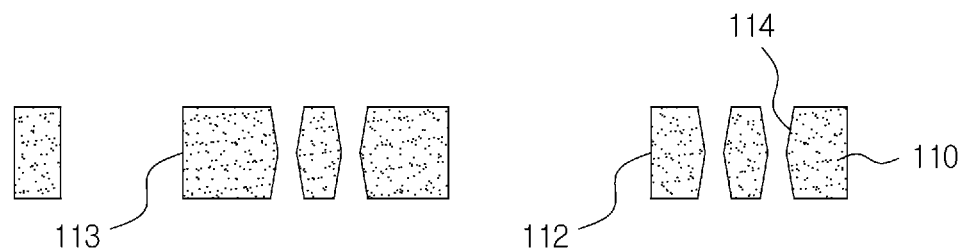
FIGS. 2 to 9 are views illustrating sequential processes of a method of manufacturing a printed circuit board having an embedded electronic device according to one or more examples.

Referring to FIG. 2, cavities 112 and 113 and a via hole 114 may be formed by performing a hole processing in a first insulating layer 110.

Figure 3:
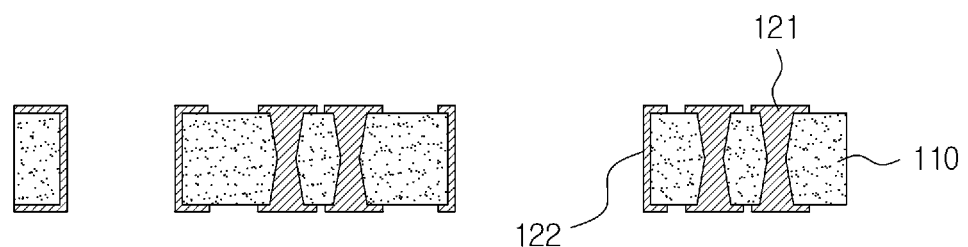

Referring to FIG. 3, a via 121 and a first shielding pattern 122 may be formed by primarily performing a plating on the first insulating layer 110, the via 121 penetrating through the first insulating layer 110 in the via hole 114 and the first shielding pattern 122 being formed on an inner wall of the cavity 112.

Figure 4:
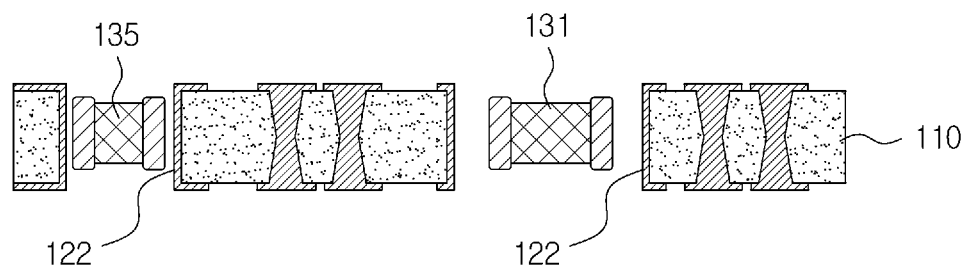
Figure 5:
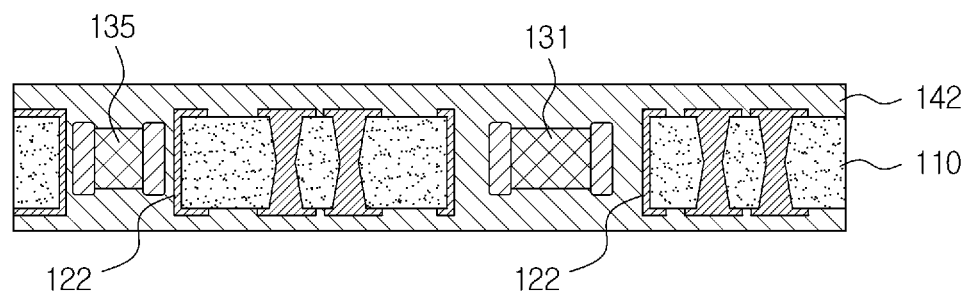

Referring to FIGS. 4 and 5, an electronic device 135 and a dummy 131 may be respectively positioned in the cavities 113 and 112 of the first insulating layer 110 and thereafter, an insulating material 142 may be primarily stacked on the electronic device 135 and the dummy 131. In this manner, the electronic device 135 and the dummy 131 may be respectively embedded in the cavities 113 and 112. The insulating material 142 may be introduced into the cavities 112 and 113, and thereby the dummy 131 and the electronic device 135 may be respectively fixed in the cavities 112 and 113 in a state of being spaced apart from the first shielding pattern 122.

Here, the dummy 131 may be inserted into the cavity 112 where the second shielding pattern 124 is to be formed, and the insulating material 142 may be stacked. The dummy 131 may allow the insulating material 142 to be stacked on the first insulating layer 110 in a flat manner.

Figure 6:
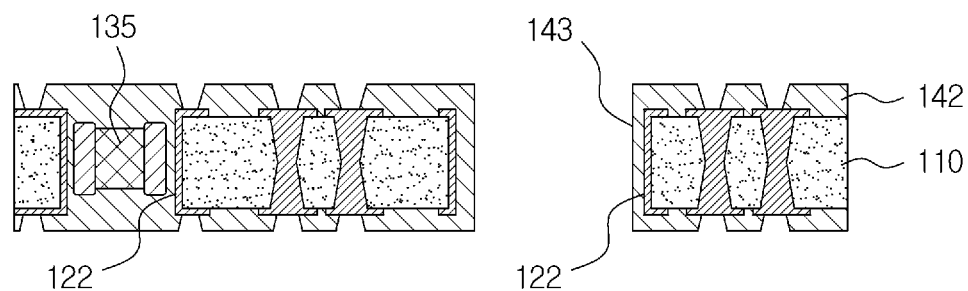

Referring to FIG. 6, a through-hole 143 may be formed in the cavity 112 by performing a hole processing in the insulating material 142 in the cavity 112 where the second shielding pattern 124 is to be formed. The dummy 131 may also be removed in the hole processing.

Figure 7:
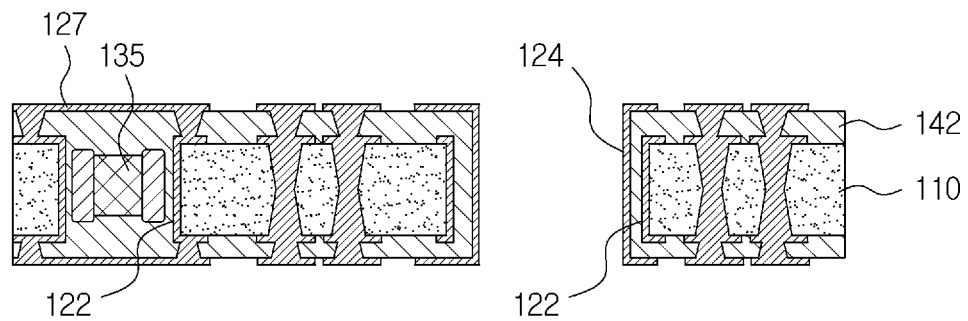

Referring to FIG. 7, the second shielding pattern 124 may be formed in the through-hole 143 formed in the insulating material 142 by secondarily performing a plating. Here, a circuit pattern including a via, a pad, etc. may also be formed. In addition, a third shielding pattern 127 covering upper and lower surfaces of the cavity 113 may also be formed in the cavity 113 where only the first shielding pattern 122 is formed.

Figure 8:
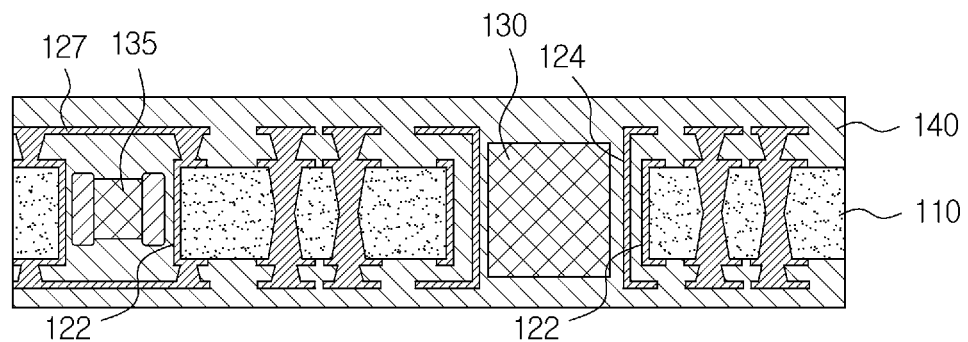

Referring to FIG. 8, a second insulating layer 140 may be formed by positioning the electronic device 130 in the through-hole 143 and secondarily stacking the insulating material. The insulating material secondarily stacked may be introduced into the through-hole 143 and may embed the electronic device 130 therein in a state in which the electronic device 130 is spaced apart from the second shielding pattern 124.

Figure 9:
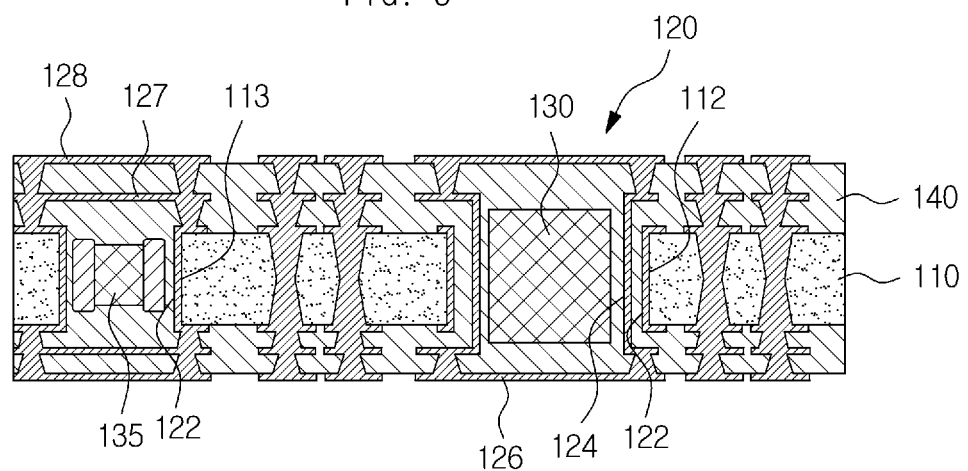

Referring to FIG. 9, a third shielding pattern 126 may be formed on upper and lower surfaces of the cavity 112 of the second insulating layer 140 by thirdly performing a plating. Here, a circuit pattern including a via, a pad, etc. may also be formed. Further, a third shielding pattern 128 may be additionally formed on the cavity 113 where only the first shielding pattern 122 is formed, and thereby the third shielding patterns 127 and 128 may be formed in a multilayer structure.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
a first insulating layer comprising a cavity;
a metal pattern comprising a first shielding pattern disposed on an inner wall of the cavity and a second shielding pattern spaced apart from the first shielding pattern and covering the first shielding pattern;
an electronic device positioned in the cavity and surrounded by the first shielding pattern and the second shielding pattern; and
a second insulating layer stacked on the first insulating layer and embedding the electronic device therein,
wherein the first shielding pattern and the second shielding pattern are separated in a width direction of the cavity and a height direction of the cavity by the second insulating layer disposed between the first shielding pattern and the second shielding pattern.

2. The printed circuit board of claim 1, wherein the metal pattern further comprises a third shielding pattern disposed on the second insulating layer and positioned to cover opened surfaces of the cavity.

3. The printed circuit board of claim 2, wherein the third shielding pattern is connected to one or more of the first shielding pattern and the second shielding pattern to form a shield can structure surrounding the electronic device.

4. The printed circuit board of claim 3,
wherein the metal pattern further comprises a ground pattern serving as a ground circuit, and
one or more of the first shielding pattern, the second shielding pattern, and the third shielding pattern is connected to the ground pattern.

5. The printed circuit board of claim 1,
wherein the first insulating layer is a core layer and the cavity penetrates through the core layer, and
the second insulating layer is stacked on each of both surfaces of the first insulating layer and fills the cavity.

6. A printed circuit board, comprising:
a cavity;
an electronic device disposed in the cavity; and
a metal pattern comprising:
a first shielding pattern spaced apart from and surrounding a second shielding pattern, which in turn is spaced apart from and surrounds the electronic device,
wherein the first and second shielding patterns are spaced apart from each other in a side-to-side direction and an up-and-down direction in a side view.

7. The printed circuit board of claim 6, further comprising a first insulating layer comprising the cavity.

8. The printed circuit board of claim 7, further comprising a second insulating layer embedding the electronic device in the cavity, the first shielding pattern, and the second shielding pattern,
wherein the first shielding pattern is disposed on a wall of the cavity.

9. The printed circuit board of claim 8,
wherein the first insulating layer is a core layer and the cavity penetrates through the core layer, and
the second insulating layer is stacked on each of both surfaces of the first insulating layer and fills the cavity.

10. The printed circuit board of claim 7, wherein the metal pattern further comprises a third shielding pattern disposed on the second insulating layer and positioned to cover one or more opened surfaces of the cavity.

11. The printed circuit board of claim 10, wherein the third shielding pattern comprises a multilayer structure, wherein the layers are spaced apart from each other and from the electronic device by the second insulating layer.

12. The printed circuit board of claim 10, wherein the third shielding pattern is connected to one or more of the first shielding pattern and the second shielding pattern to form a shield can structure surrounding the electronic device.

13. The printed circuit board of claim 10, wherein the metal pattern further comprises a ground pattern serving as a ground circuit, and
one or more of the first shielding pattern, the second shielding pattern, and the third shielding pattern is connected to the ground pattern.

14. A printed circuit board, comprising:
a cavity;
an electronic device disposed in the cavity; and
a metal pattern comprising:
a side shielding pattern disposed on a wall of the cavity, spaced apart from and surrounding the electronic device, and
an end shielding pattern connected to the side shielding pattern to form a shield can structure surrounding the electronic device,
wherein the end shielding pattern comprises a multilayer structure, wherein the layers are spaced apart from each other and from the electronic device by an insulating layer.

15. The printed circuit board of claim 14, wherein the side shielding pattern comprises a first shielding pattern spaced apart from and surrounding a second shielding pattern, which in turn is spaced apart from and surrounds the electronic device, wherein the first and second shielding patterns are spaced apart from each other and from the electronic device by the insulating layer.

16. The printed circuit board of claim 14, wherein the insulating layer comprises a first insulating layer comprising the cavity; and a second insulating layer stacked on the first insulating layer and embedding the electronic device therein.

17. The printed circuit board of claim 14, wherein the metal pattern further comprises a ground pattern serving as a ground circuit, and
   one or more of the side shielding pattern and the end shielding pattern is connected to the ground pattern.

18. The printed circuit board of claim 14,
   wherein the first insulating layer is a core layer and the cavity penetrates through the core layer, and
   the second insulating layer is stacked on each of both surfaces of the first insulating layer and fills the cavity.

* * * * *